(12) United States Patent
Kim et al.

(10) Patent No.: US 11,616,199 B2
(45) Date of Patent: Mar. 28, 2023

(54) TENSION MASK FRAME ASSEMBLY MANUFACTURING APPARATUS AND METHOD

(71) Applicant: KPS CO., LTD., Hwaseong-si (KR)

(72) Inventors: Jung Ho Kim, Hwaseong-si (KR); Sang Hoon Shin, Seoul (KR); Young Su Kim, Hwaseong-si (KR)

(73) Assignee: KPS CO., LTD., Hwaseong-si (KR)

( * ) Notice: Subject to any disclaimer, the term of this patent is extended or adjusted under 35 U.S.C. 154(b) by 0 days.

(21) Appl. No.: 17/590,515

(22) Filed: Feb. 1, 2022

(65) Prior Publication Data

US 2022/0158097 A1  May 19, 2022

Related U.S. Application Data

(63) Continuation of application No. 17/089,295, filed on Nov. 4, 2020, now Pat. No. 11,283,022, which is a
(Continued)

(30) Foreign Application Priority Data

Jul. 13, 2016 (KR) ........................ 10-2016-0088408

(51) Int. Cl.
*H01L 51/56* (2006.01)
*H01L 51/00* (2006.01)
*C23C 14/04* (2006.01)

(52) U.S. Cl.
CPC ........ *H01L 51/0011* (2013.01); *C23C 14/042* (2013.01); *H01L 51/001* (2013.01); *H01L 51/56* (2013.01)

(58) Field of Classification Search
CPC ... H01L 51/001; H01L 51/0011; H01L 51/56; C23C 14/042; B21D 1/14; B21D 3/12; B21D 3/14; Y10T 29/49867
See application file for complete search history.

(56) References Cited

U.S. PATENT DOCUMENTS 6,890,237 B2 * 5/2005 Nishiki ................... H01J 9/142
445/30
8,925,480 B2 * 1/2015 Kim ...................... B05C 21/005
118/721
(Continued)

OTHER PUBLICATIONS

WO 2006/009180A1, Tsuchiya et al., Jan. 2006.*
WO 2006/062035A1, Tsuchiya et al., Jun. 2006.*

*Primary Examiner* — Edward T Tolan
(74) *Attorney, Agent, or Firm* — Kile Park Reed & Houtteman PLLC (57) ABSTRACT

An apparatus for manufacturing a tension mask-frame assembly includes a frame loading unit configured to load a tension mask-frame assembly, a pressing unit configured to press the support frame, a load cell configured to measure a force applied to the support frame, and a control unit configured to control the pressing unit to pre-deform the support frame in accordance with at least a portion of a bending deformation amount of the support frame, caused by own weight of the support frame and tension of the tension mask. The pressing unit includes inward pressing members which press the pair of support frames toward the inside of the frame, and outward pressing members which press the support frame toward the outside of the frame. The outward pressing members are disposed in a slot formed in a lengthwise direction of the support frame.

3 Claims, 6 Drawing Sheets

Related U.S. Application Data continuation of application No. 16/313,373, filed as application No. PCT/KR2017/006676 on Jun. 26, 2017, now Pat. No. 10,854,816.

(56) References Cited

U.S. PATENT DOCUMENTS

| | | | |
|---|---|---|---|
| 9,327,310 B2* | 5/2016 | Kang | C23C 14/042 |
| 9,705,083 B2* | 7/2017 | Obata | H01L 51/56 |
| 9,761,802 B2* | 9/2017 | Kuriyama | H01L 51/001 |
| 9,802,276 B2* | 10/2017 | Kim | B23K 37/0408 |
| 10,043,974 B2* | 8/2018 | Obata | C23C 14/24 |
| 10,286,416 B2* | 5/2019 | Han | B23K 26/14 |

\* cited by examiner

TENSION MASK FRAME ASSEMBLY MANUFACTURING APPARATUS AND METHOD

CROSS REFERENCE TO RELATED APPLICATIONS

This application is a continuation application of U.S. patent application Ser. No. 17/089,295, filed Nov. 4, 2020 (now pending), the disclosure of which is herein incorporated by reference in its entirety. U.S. patent application Ser. No. 17/089,295 is a continuation application of U.S. patent application Ser. No. 16/313,373, filed Dec. 26, 2018 (issued to U.S. Pat. No. 10,854,816 on Dec. 1, 2020), the disclosure of which is herein incorporated by reference in its entirety. The U.S. patent application Ser. No. 16/313,373 is a national entry of International Application No. PCT/KR2017/006676, filed on Jun. 26, 2017, which claims priority to Korean Application No. 10-2016-0088408, filed on Jul. 13, 2016, the entire contents of which are incorporated herein by reference.

TECHNICAL FIELD

The present invention relates to an apparatus for manufacturing a tension mask-frame assembly, which is capable of minimizing a change in pitch of a tension mask according to deformation of a frame, and a method for manufacturing a tension mask-frame assembly.

BACKGROUND ART

Generally, among display devices, an organic light-emitting diode (OLED) has advantages such as a wide viewing angle, excellent contrast, and fast response speed.

The OLED is a display element in which holes injected in a positive electrode and electrons injected in a negative electrode are recombined in an inner organic light-emitting layer to emit visible light and display necessary information to humans. Unlike a liquid crystal display (LCD), a self-emission type element, i.e., the OLED, does not require a back light unit (BLU) and has a simple structure and thus is thin and very light. In addition, the OLED may have a faster response speed and a wider viewing angle as compared with the LCD and thus may implement a high contrast ratio and image quality at any angle. In addition, an entire panel may have a light transmittance ratio of 23% which is three times a light transmittance ratio of the LCD, and the OLED may be applicable to a flexible substrate. Thus, the OLED may be ideal for implementing a transparent display and a flexible display. Based on such advantages, the OLED receives huge attention as next generation technology which will dominate the display industry after the LCD. However, since an organic material is used as a main component of the OLED, the OLED is vulnerable to moisture and oxygen. Thus, the OLED fundamentally has a short lifespan. In addition, currently, the OLED is more expensive than the LCD, and it is difficult to manufacture the OLED so as to have high resolution and a large area.

Electrodes and intermediate layers including a light-emitting layer in the OLED may be formed through various methods, one such method is a deposition method. In order to manufacture the OLED using the deposition method, a fine metal mask (FMM) having the same pattern as that of a thin film or the like to be formed on a substrate is aligned, and a raw material of the thin film is deposited to form a thin film with a desired pattern.

When an area of the fine metal mask is increased, the number of errors in etching for forming a pattern is increased, a sagging phenomenon of a center portion of the fine metal mask is increased due to the own weight of the fine metal mask. Thus, recently, a mask-frame assembly in a type of a split mask, in which a mask is formed into several stick shapes and then is attached to a frame to use, has been preferred. Use of this split mask also has an advantage in that, when there is a problem in some split masks of an entire mask-frame assembly, only corresponding split masks may be replaced.

A deposition method includes a point source bottom-up deposition method, a point source top-down deposition method, and a linear source vertical deposition method.

In order to mass-produce an OLED display for a mobile phone, a size of glass for deposition is increased. As the size of the glass for deposition is increased, a size of a frame is increased. When point source bottom-up or top-down deposition is performed using a frame having a large size, since a sagging phenomenon of a mask is increased at a center of a frame, adhesion between the glass and the mask is limited, resulting in deposition defects. Therefore, it is advantageous to apply a linear source vertical vacuum deposition method as the size of the glass is increased.

In the linear source vertical vacuum deposition system, a tension mask frame is deformed according to the load thereof due to gravity. Such deformation of the frame caused by the load causes a change in the pattern of a fixed tension mask, resulting in an error in pattern formation during a deposition operation.

DISCLOSURE

Technical Problem

In order to solve above problems, the present invention is directed to providing an apparatus for manufacturing a tension mask-frame assembly, which is capable of minimizing a change of a frame caused by the load of the frame and tension of a tension mask during welding of the tension mask and the frame, and a method for manufacturing a tension mask-frame assembly.

Technical Solution

In order to achieve the above objects, provided is an apparatus for manufacturing a tension mask-frame assembly in which a tension mask is mounted on a frame which has rectangular frame shape and includes a pair of support frames, to which opposite edges of the tension mask with a rectangular sheet shape are fixed, and a pair of connection frames configured to connect both ends of the support frames to each other. The apparatus includes: a frame loading unit configured to load a tension mask-frame assembly; a pressing unit configured to press the support frame between both ends thereof in a plate surface direction of the support frame; and a control unit configured to control the pressing unit to pre-deform the support frame in accordance with at least a portion of a bending deformation amount of the support frame, caused by own weight of the support frame and tension of the tension mask. According to the apparatus for manufacturing a tension mask-frame assembly, own weight deformation of the support frame of the tension mask-frame assembly may be minimized during vertical vacuum deposition by pre-deforming the frame in accordance with deformation caused by the own weight of the frame, thereby reducing an error in pattern formation.

The pressing unit may include a plurality of inward pressing members which are spaced apart from each other in a lengthwise direction of the pair of support frames and press the pair of support frames toward the inside of the frame. When deformation corresponding to tension deformation of the tension mask and deformation corresponding to own weight deformation are generated in the same direction, the inward pressing members may perform additional pressing. When the deformation corresponding to the tension deformation of the tension mask and the deformation corresponding to the own weight deformation are generated in opposite directions, the inward pressing members may perform offset pressing.

The pressing unit may include a plurality of outward pressing members which are spaced apart from each other in the lengthwise direction of the pair of support frames and press the pair of support frames toward the outside of the frame. When the deformation corresponding to the tension deformation of the tension mask and the deformation corresponding to the own weight deformation are generated in the same direction, the inward pressing members may perform additional pressing. When the deformation corresponding to the tension deformation of the tension mask and the deformation corresponding to the own weight deformation are generated in opposite directions, pressing may be performed using the outward pressing members.

The control unit may control the pressing member based on a predicted own weight deformation amount of each of the pair of the support frames and a tension deformation amount of the tension mask.

According to an embodiment of the present invention, provided is a method of manufacturing a tension mask-frame assembly in which a tension mask is mounted on a frame which has rectangular frame shape and includes a pair of support frames, to which opposite edges of the tension mask with a rectangular sheet shape are fixed, and a pair of connection frames configured to connect both ends of the support frames to each other. The method includes: loading the frame on a frame loading unit; pre-deforming the support frame in accordance with at least a portion of a bending deformation amount of the support frame, caused by own weight of the support frame and tension of the tension mask; clamping the tension mask on the pre-deformed frame; tensioning the tension mask; and fixing the tensioned tension mask to the pre-deformed frame Advantageous Effects According to an apparatus and method for manufacturing a tension mask-frame assembly, own weight deformation of a support frame of a tension mask-frame assembly can be minimized during vertical vacuum deposition by pre-deforming the frame in accordance with deformation caused by the own weight of the frame, thereby reducing errors in pattern formation.

MODES OF THE INVENTION

Hereinafter, embodiments of the present disclosure will be described with reference to the accompanying drawings. It is however to be understood that the present invention is not intended to be limited to the specific embodiments and the present invention includes various modifications, equivalents, and substitutions of embodiments of the present invention. In connection with descriptions of the drawings, similar components may be designated by the same reference numeral.

In the disclosure disclosed herein, the expressions "have," "may have," "include" and "comprise," or "may include" and "may comprise" used herein indicate the presence of corresponding features (for example, elements such as numeric values, functions, operations, or components) and do not preclude the presence of additional features.

In the disclosure disclosed herein, the expressions "A or B," "at least one of A and/or B," or "one or more of A and/or B," and the like used herein may include any and all possible combinations of the associated listed items. For example, the term "A or B," "at least one of A and B," or "at least one of A or B" may refer to all of the case (1) where at least one A is included, the case (2) where at least one B is included, and the case (3) where both of at least one A and at least one B are included.

The terms, such as "first," "second," and the like used herein, may refer to various elements of various embodiments of the present invention, but do not limit the elements. For example, such terms do not limit the order and/or priority of the elements. Furthermore, such terms may be used to distinguish one element from another element. For example, without departing from the scope of the present invention, a first element may be referred to as a second element, and similarly, a second element may be referred to as a first element.

It will be understood that when an element (for example, a first element) is referred to as being "coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term "configured to (or set to)" may not necessarily mean only "specifically designed to" in hardware. Instead, the expression "a device configured to" may mean that the device is "capable of" operating together with another device or other components.

Terms used in the present invention are used to describe specified embodiments of the present invention and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the present invention. In some cases, even when the terms are terms which are defined in the specification, they may not be interpreted to exclude the embodiments of the present invention.

When a tension mask is attached to a frame, the tension mask is tightly pulled in a lengthwise direction thereof. When the tension mask is coupled to a support frame 12 in a state in which the tension mask is not tightly pulled, a rough wave is generated in the tension mask. The rough wave reduces adhesion between the tension mask and a substrate in a subsequent deposition process, which functions as a factor which hinders accurate deposition. Therefore, when the tension mask is attached to the support frame 12, both ends of the tension mask are welded to the support frame 12 after the tension mask is tightly pulled in the lengthwise direction thereof. In order to weld the tension mask to the support frame 12 so as to have the same pattern as a pattern of a thin film or the like to be formed on the substrate, the tension mask is pulled and is welded to the support frame 12 such that the pattern of the thin film and the pattern of the split tension mask match each other. In this case, the tensioned tension mask pulls the support frame 12 inward to deform the support frame 12. As a result, the pattern of the thin film and the pattern of the split mask do not match each other. In order to match the patterns, only when the support frame 12 is pre-deformed by applying a force by which the tension mask pulls the support frame 12 inward, the support frame 12 is not deformed after the welding. The force pre-applied to pre-deform the support frame 12 is referred to as a "counter force".

For example, a tension mask-frame assembly 10 with a large size of 6 GH is used in an erected state in a vertical vacuum deposition method. In this case, the support frame 12 to which the tension mask is attached is deformed by load thereof. Therefore, during vertical vacuum deposition, an appropriate force is pre-applied to pre-deform the support frame 12 in consideration of load deformation of the support frame 12 according to the load. In this case, the force applied to minimize the load deformation is referred to as a "reverse counter force".

Figure 1:
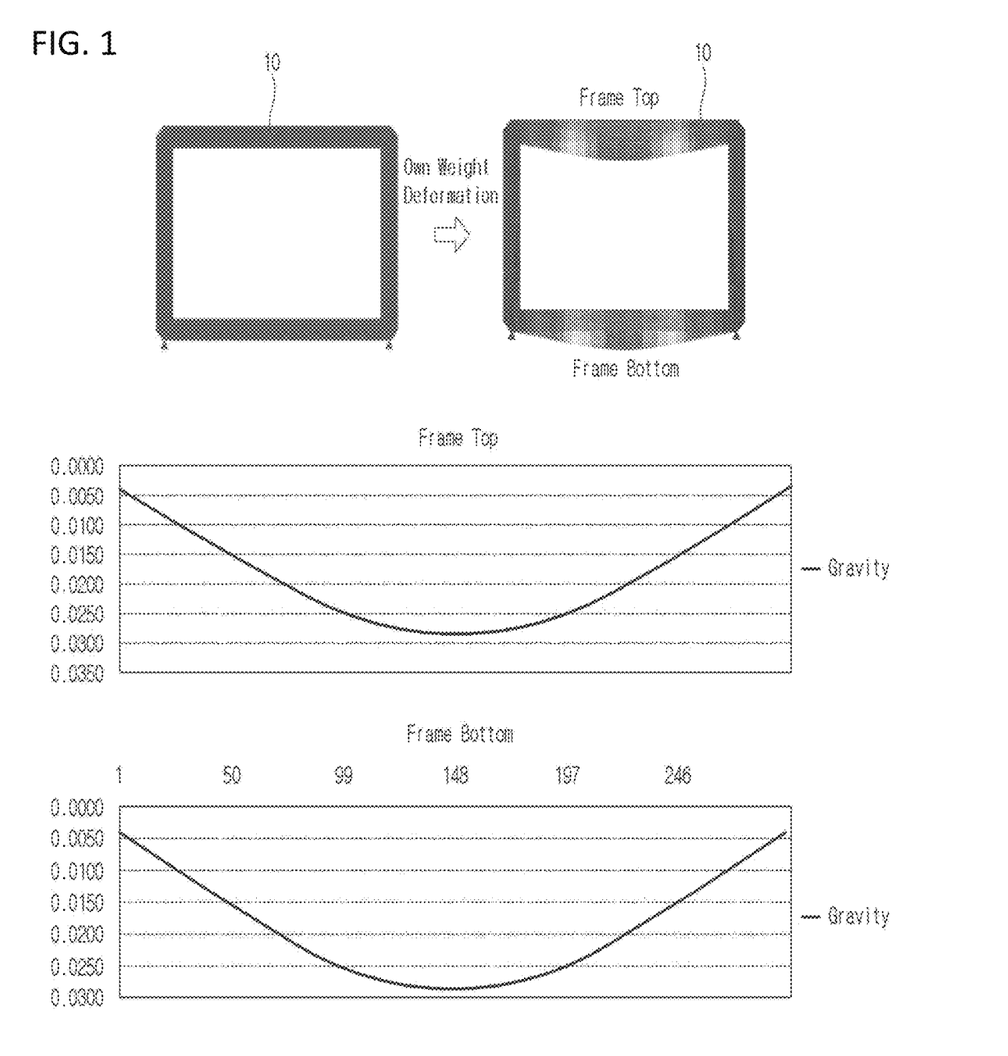
FIG. 1 illustrates a shape and a graph showing an interpretation of deformation of a frame, caused by the own weight of the frame.

FIG. 1 illustrates a shape and a graph showing own weight deformation of a frame 10 with the size of 6 GH. As shown, when the frame 10 is erected, a middle portion of each of upper and lower support frames is most deformed by load (gravity) thereof, and deformation is gradually decreased toward both sides of each of the upper and lower support frames. In this case, it can be seen that the upper and lower support frames are deformed in a similar manner.

Figure 2:
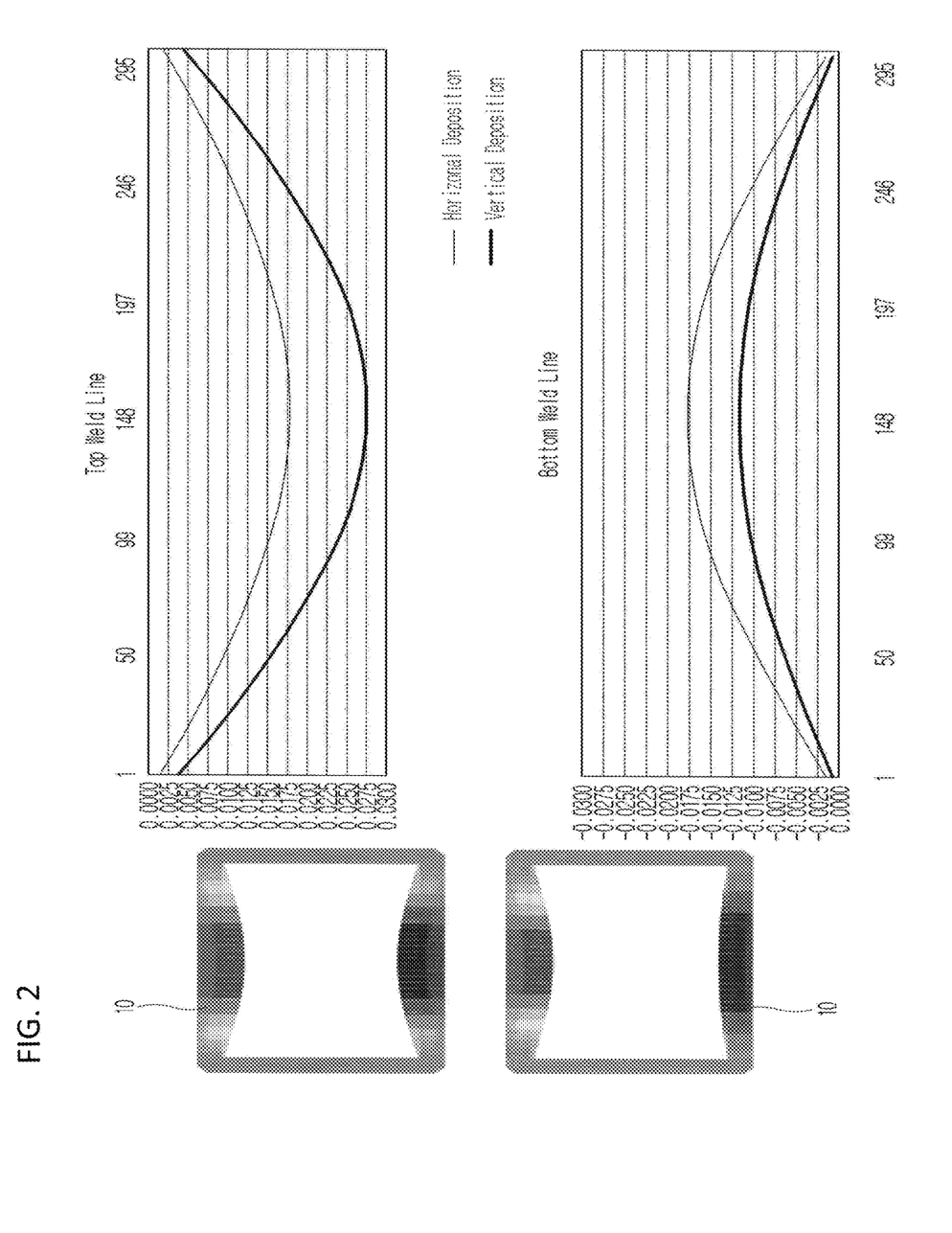
FIG. 2 illustrates a shape and a graph showing an interpretation of deformation of an upper frame and deformation of a lower frame, caused by the own weight of the frames and tension of a tension mask.

FIG. 2 illustrates a shape and a graph showing deformation of the frame with the size of 6 GH during each of horizontal deposition and vertical deposition. As shown, it can be seen that tension and the load of the tension mask act in the same direction and thus deformation of the upper support frame during the vertical deposition is greater than that during the horizontal deposition. It can be seen that the tension and load of the tension mask act in opposite directions and thus deformation of the lower support frame during the vertical deposition is less than that during the horizontal deposition.

Figure 3:
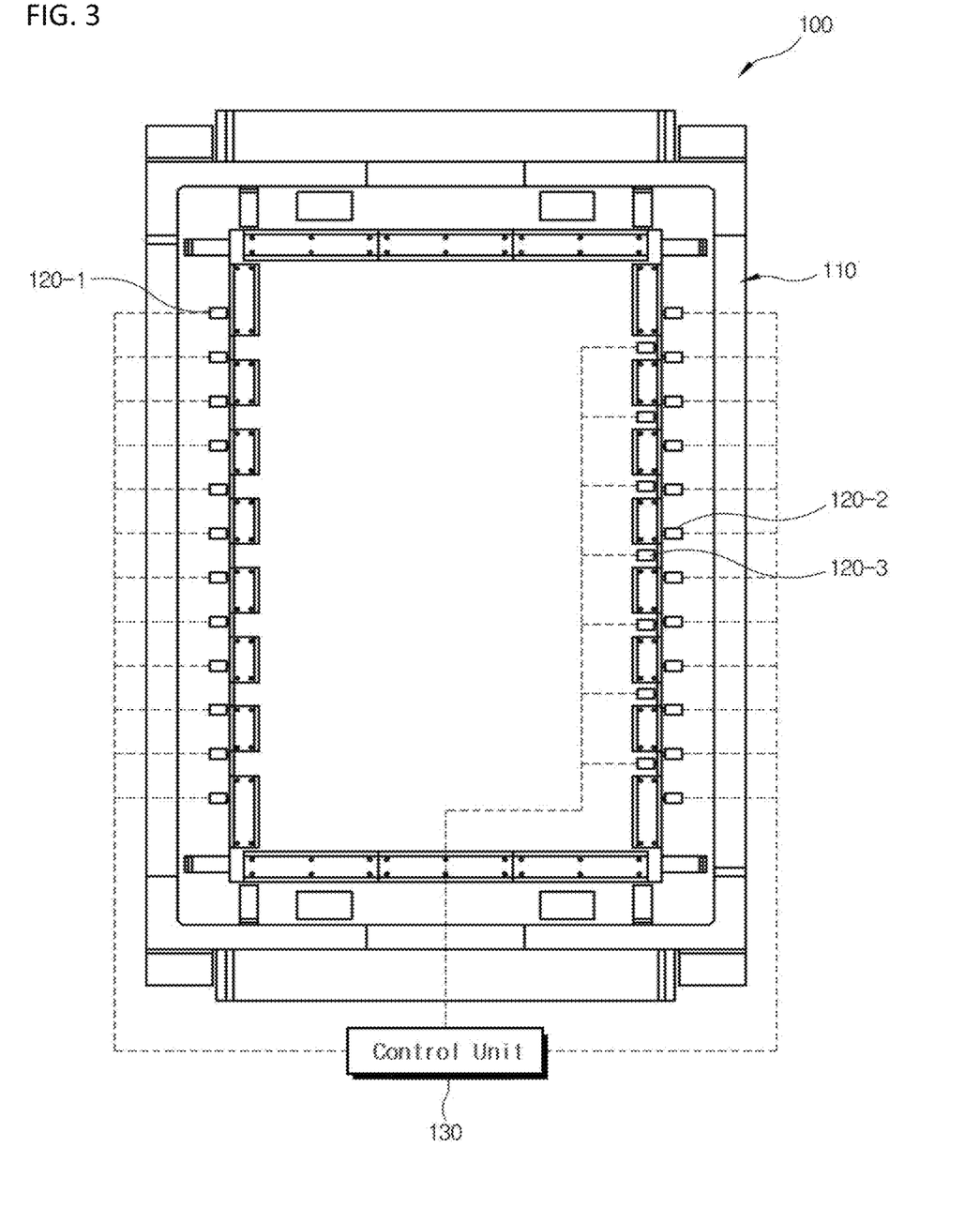
FIG. 3 is a view illustrating an apparatus for manufacturing a tension mask-frame assembly according to an embodiment of the present invention.

FIG. 3 illustrates an apparatus 100 for manufacturing a tension mask-frame assembly according to an embodiment of the present invention. As shown, the apparatus 100 for manufacturing a tension mask-frame assembly includes a frame loading unit 110 configured to load a tension mask-frame assembly 10, pressing units 120-1, 120-2, and 120-3 configured to press a support frame between both ends thereof in a plate surface direction of the support frame, and a control unit 130 configured to control the pressing units 120-1, 120-2, and 120-3.

The frame loading unit 110 functions to stably support a frame 10 so as to weld a tension mask. Although not shown in FIG. 3, the frame loading unit 110 may further include a clamp (not shown) configured to clamp a tension mask disposed on a pair of support frames 12 on the supported frame 10, a pulling portion (not shown) configured to pull the clamped tension mask, and a welding portion (not shown) configured to weld both ends of the tension mask while moving along the support frame 12.

Figure 4:
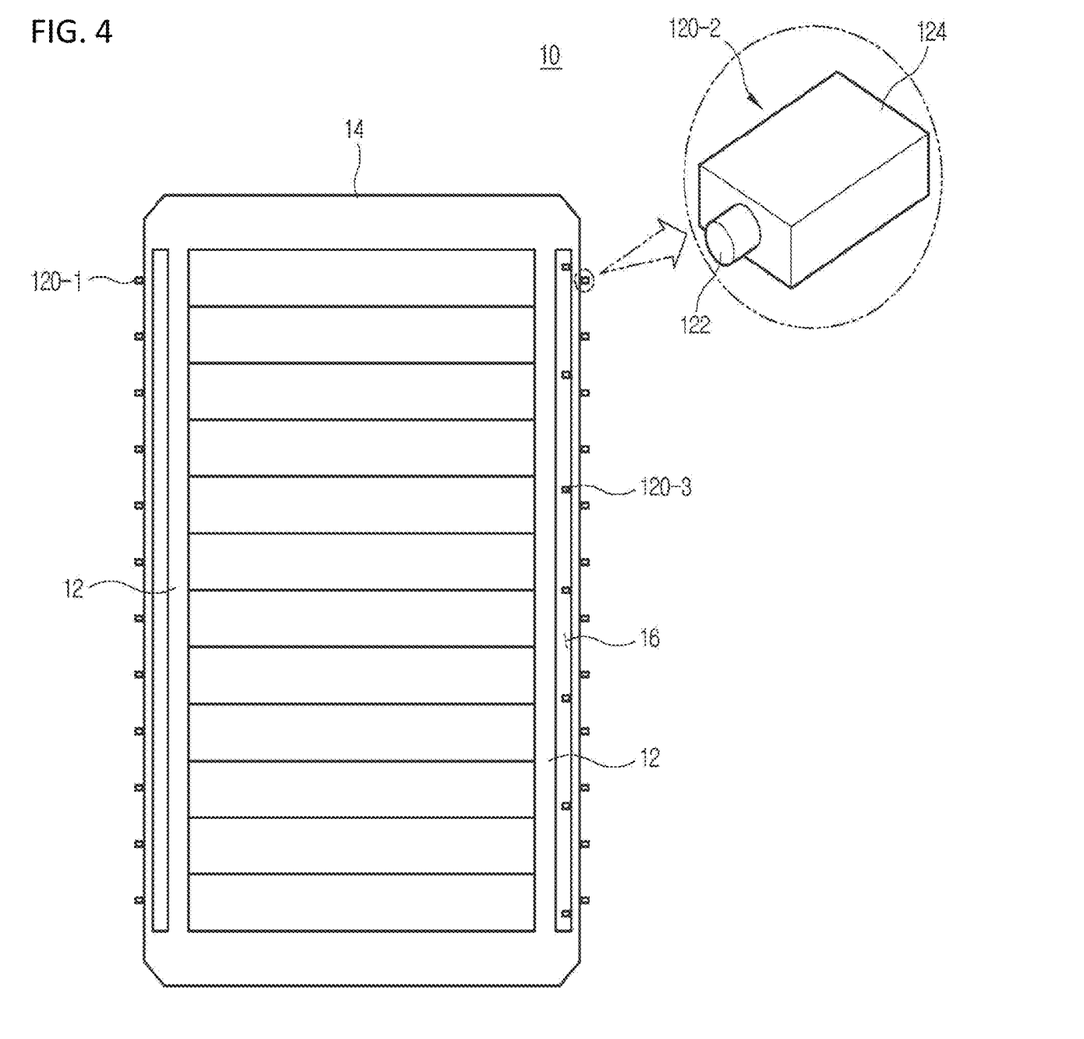
FIG. 4 is a schematic view illustrating a concept of pre-deforming a frame in consideration of deformation caused by tension of a tension mask and the load of the frame.

As shown in FIG. 4, the tension mask-frame assembly includes the frame 10 with a rectangular frame shape which includes the pair of support frames 12 to which opposite edges of the tension mask with a rectangular sheet shape are fixed, and a pair of connection frames 14 configured to connect both ends of the support frames 12 to each other. The tension mask-frame assembly may be applied to a tension mask which is split into 12 pieces and fixed. However, the tension mask-frame assembly may be applied to a tension mask which is split into pieces of which the number is greater than or less than 12.

The pressing units 120-1, 120-2, and 120-3 press the support frames 12 of the frame 10 outward and inward in a state of being supported by the frame loading unit 110. As shown in the enlarged view in FIG. 4, the pressing units 120-1, 120-2, and 120-3 each include an elastic pressing member 122 and a driving body 124. A front end of the elastic pressing member 122 may be moved forward and backward with respect to the support frame 12. The driving body 124 includes a driver (not shown) such as a motor configured to move the elastic pressing member 122 forward and backward, and a load cell (not shown). The load cell measures a force applied to the support frame 12 through the elastic pressing member 122, and stops when the measured force reaches a value input in the control unit 130.

The pressing units 120-1, 120-2, and 120-3 include first and second inward pressing members 120-1 and 120-2 configured to press the pair of support frames 12 inward in a plate surface direction from outside the frame, and outward pressing members 120-3 configured to press the support frame 12 outward in the plate surface direction from the inside to the outside of the frame. In FIGS. 3 and 4, 12 first inward pressing members 120-1, 12 second inward pressing members 120-2, and 7 outward pressing members 120-3 are provided, but the present invention is not limited thereto. The numbers of the first and second pressing members 120-1 and 120-2 and the outward pressing members 120-3 may be appropriately adjusted and provided.

In consideration of deformation caused by tension of the tension mask 10 and deformation caused by the load of the support frame 12, the first inward pressing member 120-1 presses and pre-deforms an upper support frame 12, i.e., a support frame 12 disposed at an upper side when the tension mask 10 is used in an vertically erected state. In this case, it is advantageous for only the first inward pressing member to adjust the tension and load acting on the support frame disposed at the upper side in the same direction. Of course, it is also possible to install and apply a separate inward pressing member.

Figure 5:
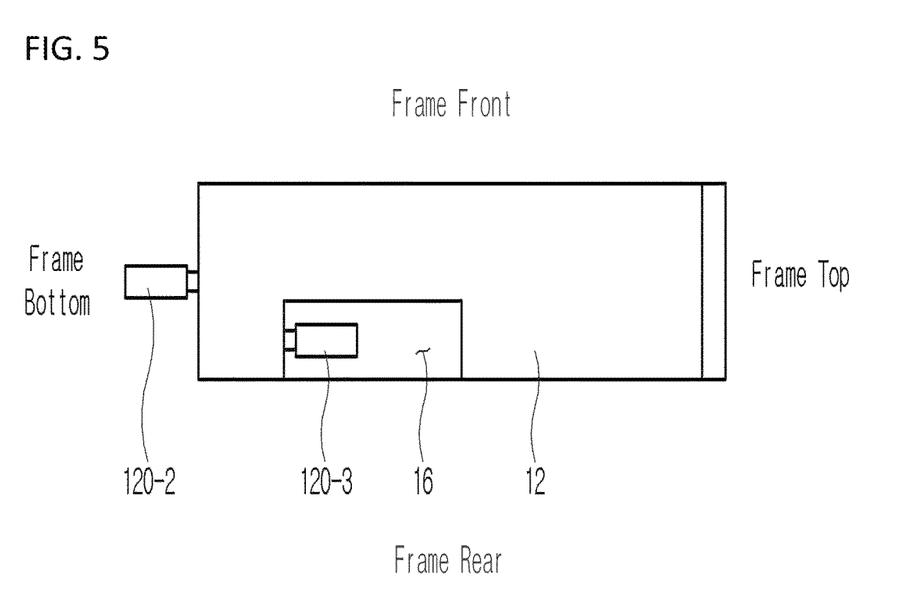
FIG. 5 is a cross-sectional view illustrating an apparatus for pre-deforming a frame in consideration of deformation caused by tension of a tension mask and the load of the frame.

FIG. 5 is a schematic view illustrating a state in which a lower support frame is pressed by the second inward pressing member 120-2 and the outward pressing member 120-3.

By applying a force in consideration of deformation caused by tension of the tension mask 10, the second inward pressing member 120-2 presses and pre-deforms a lower support frame 12, i.e., a support frame 12 disposed at a lower side when the tension mask 10 is used in a vertically erected state.

The outward pressing member 120-3 is disposed in a slot 16 formed in a lengthwise direction of the lower support frame 12, i.e., the support frame 12 disposed at a lower side when the tension mask 10 is used in a vertically erected state, and thus presses the support frame 12 outward in the plate surface direction. In this case, the driving body 124 of the outward pressing member 120-3 presses the support frame only through forward and backward movements of the elastic pressing member 122 in a state of being fixed to the frame loading unit 110.

In addition, the outward pressing member 120-3, which presses the support frame 12 disposed at the lower side, may be omitted, and the support frame 12 may be adjusted using only the second inward pressing member 120-2. That is, the support frame 12 may be adjusted so as to offset gravity acting in an opposite direction to tension of the tension mask. In this case, since the number of variables, which should be taken into consideration when a plurality of pressing members are adjusted for pre-deforming, is increased, there are a few disadvantages in terms of operation.

The control unit 130 is implemented as a computer including a processor for controlling the motor and the load cell included in each of the pressing units 120-1, 120-2, and 120-3. The processor may be implemented by hardware such as a control board, software, or a combination of hardware and software, wherein the control board includes a central processing unit (CPU), a micro processing unit (MPU), application specific integrated circuits (ASICs), digital signal processors (DSPs), digital signal processing devices (DSPDs), programmable logic devices (PLDs), field programmable gate arrays (FPGAs), micro-controllers, microprocessors, etc.

The control unit 130 may obtain and store a bending deformation value of the support frame caused by tension of the tension mask 10 and a bending deformation value of the support frame caused by load in advance through a simulation. The control unit 130 controls the pressing units 120-1, 120-2, and 120-3 to pre-deform the support frame in accordance with at least a portion of the stored bending deformation value of the support frame caused by the tension and the stored bending deformation value of the support frame caused by the load.

Figure 6:
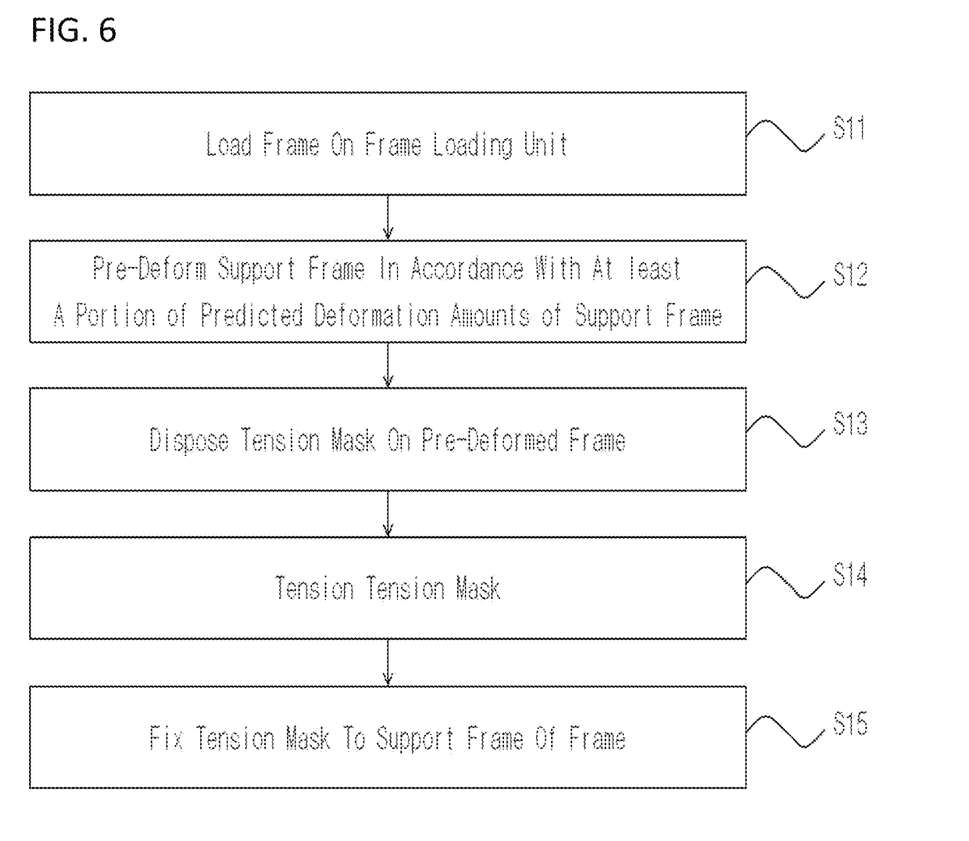
FIG. 6 is a flowchart of a method for manufacturing a tension mask-frame assembly according to the present invention.

FIG. 6 is a flowchart of a method for manufacturing a tension mask-frame assembly method according to the present invention.

In operation S11, the frame 10 is loaded on the frame loading unit 110. In this case, the frame 10 is in a state in which the tension mask 1 is not welded thereto, and is stably supported by the frame loading unit 110. The frame loading unit 110 supports the frame 10 such that the frame is not moved by the pair of connection frames 14. In this case, the first inward pressing member 120-1 is disposed in contact with an outer surface of the upper support frame 12 of the frame 10. The second inward pressing member 120-2 is disposed in contact with an outer surface of the lower support frame 12. The outward pressing member 120-3 is disposed in contact with an inner surface of the lower support frame 12. The pressing members 120-1, 120-2, and 120-3 are in contact with the outer surface or the inner surface of the support frame 12 and do not press the support frame 12.

In operation S12, the control unit 130 controls each of the pressing members 120-1, 120-2, and 120-3 to apply a force to the upper support frame and the lower support frame, wherein the force corresponds to tension of the tension mask and the load of the support frame. As a result, the support frame 12 of the frame 10 is pre-deformed by a force corresponding to the tension of the tension mask and the load of the support frame in a state in which the tension mask is not attached thereto. In this case, a pattern of the tension mask is set to be applied during vertical deposition.

In operation S13, the tension mask to be welded is clamped on the frame 10 in a state in which the support frame 12 is pre-deformed. In this case, both ends of the tension mask are fixed by a clamp.

In operation S14, the clamped tension mask is tensioned by applying tension corresponding to the tension applied in operation S12.

In operation S15, both ends of the tension mask to which tension is applied are fixed to the pair of deformed support frames 12, for example, through wielding. In this case, when a pressurizing state of each of the pressing members 120-1, 120-2, and 120-3 is released, the deformed support frames 12 are balanced by the tension mask to which tension is applied. However, in a horizontal state, the support frame 12 is restored by a load deformation amount in additional consideration of load. As a result, such restoration causes the pattern of the tension mask to deviate from a state set to be applied during vertical deposition. When the tension mask-frame assembly is erected for vertical deposition, the support frame 12 is again in the deformed state set in operation S12 by the load of the support frame 12. As a result, the pattern of the tension mask is also in a state set to be applied for vertical deposition. As described above, when the tension mask-frame assembly is manufactured, the support frame may be pre-deformed in consideration of pre-deformation, and then, the tension mask may be welded, thereby preventing the pattern of the tension mask from being changed due to the tension of the tension mask or the load of the support frame.

While the present invention has been described with reference to the limited exemplary embodiments and the drawings, the present invention is not limited to the exemplary embodiments, and it will be understood by those or ordinary skill in the art that various modifications and alterations may be made therein.

Therefore, it should be noted that the scope of the present invention is not limited to the exemplary embodiments described above and is determined by the claims and equivalents thereof.

The invention claimed is:

1. An apparatus for manufacturing a tension mask-frame assembly in which a tension mask is mounted on a frame which has a rectangular frame shape and includes a pair of support frames, to which opposite edges of the tension mask with a rectangular sheet shape are fixed, and a pair of connection frames configured to connect both ends of the support frames to each other, the apparatus comprising:
- a frame loading unit configured to load a tension mask-frame assembly;
- a pressing unit configured to press the support frame between both ends thereof in a plate surface direction of the support frame;
- a load cell configured to measure a force applied to the support frame; and
- a control unit configured to control the pressing unit to pre-deform the support frame in accordance with at least a portion of a bending deformation amount of the support frame, caused by own weight of the support frame and tension of the tension mask, wherein
- the pressing unit includes a plurality of inward pressing members which are spaced apart from each other in a lengthwise direction of the pair of support frames and press the pair of support frames toward the inside of the frame,
- the pressing unit includes a plurality of outward pressing members which are spaced apart from each other in a lengthwise direction of the support frame and press the support frame toward the outside of the frame,
- the outward pressing members each includes an elastic pressing member and a driving body, and
- a front end of the elastic pressing member is moved forward and backward with respect to the support frame.

2. The apparatus of claim 1, wherein the control unit controls the pressing member based on a predicted own weight deformation amount of each of the pair of the support frames and a tension deformation amount of the tension mask.

3. A method of manufacturing a tension mask-frame assembly in which a tension mask is mounted on a frame which has rectangular frame shape and includes a pair of support frames, to which opposite edges of the tension mask with a rectangular sheet shape are fixed, and a pair of connection frames configured to connect both ends of the support frames to each other, the method comprising:
- loading the frame on a frame loading unit;
- pre-deforming the support frame in accordance with at least a portion of a bending deformation amount of the support frame, caused by own weight of the support frame and tension of the tension mask;
- clamping the tension mask on the pre-deformed frame;
- tensioning the tension mask;
- fixing the tensioned tension mask to the pre-deformed frame;
- pressing the pair of support frames toward the inside of the frame via a plurality of inward pressing members which are spaced apart from each other in a lengthwise direction; and
- pressing the support frame toward the outside of the frame via a plurality of outward pressing members which are spaced apart from each other in a lengthwise direction, wherein
- each of the outward pressing members includes an elastic pressing member and a driving body, and
- a front end of the elastic pressing member is moved forward and backward with respect to the support frame.

* * * * *